US010409930B2

(12) United States Patent
Lambert (10) Patent No.: US 10,409,930 B2
(45) Date of Patent: Sep. 10, 2019

(54) TECHNIQUES FOR IMPROVING SWEPT SINE ANALYSES (71) Applicant: HARMAN INTERNATIONAL INDUSTRIES, INC., Stamford, CT (US)

(72) Inventor: Russell H. Lambert, Highland, UT (US)

(73) Assignee: HARMAN INTERNATIONAL INDUSTRIES, INCORPORATED, Stamford, CT (US)

(*) Notice: Subject to any disclaimer, the term of this patent is extended or adjusted under 35 U.S.C. 154(b) by 904 days.

(21) Appl. No.: 14/864,556

(22) Filed: Sep. 24, 2015

(65) Prior Publication Data
US 2017/0089963 A1 Mar. 30, 2017

(51) Int. Cl.
G06F 17/10 (2006.01)
G06F 7/60 (2006.01)
G06F 17/50 (2006.01)

(52) U.S. Cl.
CPC ........ *G06F 17/5009* (2013.01); *G06F 17/504* (2013.01); *G06F 17/5036* (2013.01)

(58) Field of Classification Search
CPC . G06F 17/504; G06F 17/5009; G06F 17/5036
USPC .......................................................... 703/2
See application file for complete search history.

(56) References Cited

U.S. PATENT DOCUMENTS 9,503,815 B2 * 11/2016 Ramprashad ......... H04M 19/08
2011/0255699 A1 * 10/2011 Osada .................... H03G 3/32
381/57

OTHER PUBLICATIONS

Farina et al. (Non-linear Convolution: A New Approach for the Auralization of Distortion system, (20 pages)). (Year: 2008).*
Farina (Simultaneous measurement of impulse and distortion with a swept-sine technique, (24 pages). (Year: 2000).*
Farina, "Simultaneous measurement of impulse response and distortion with a swept-sine technique", Presented at the 108th Convention, Feb. 19-22, 2000, 24 pages.
Lambert, "General Volterra and Swept-Sine Diagonal System Estimation and Modeling Performance", Audio Engineering Society, Presented at the 137th Convention, Oct. 9-12, 2014, 8 pages.

* cited by examiner

Primary Examiner — Andre Pierre Louis
(74) Attorney, Agent, or Firm — Artegis Law Group, LLP (57) ABSTRACT A software application uncovers phase spreading that corrupts the linear response filters of a nonlinear system and executes a corrective algorithm that generates true-phase filters of the response over all nonlinear orders used in the analysis. The application first outputs a signal with logarithmically changing frequency, as a stimulus to generate a set of Farina harmonic response filters. The application then constructs an identity model and excites the identity model with an identical input under identical conditions, to generate a set of spreading function filters. The application computes the inverse of the spreading function filters and convolves the inverse spreading function filters with the Farina harmonic response filters to generate a set of spreading corrected filters. Finally, the application constructs the unmixing Chebyshev matrix and convolves the spreading correction filters with the unmixing Chebyshev matrix to remove the spreading and generate harmonically pure and phase-corrected filters.

20 Claims, 5 Drawing Sheets

TECHNIQUES FOR IMPROVING SWEPT SINE ANALYSES

BACKGROUND

Field of the Various Embodiments

The various embodiments relate generally to nonlinear systems analysis and, more specifically, to techniques for improving swept sine analyses. The various embodiments relate to improvement of existing analysis techniques so that they characterize nonlinear systems more exactly. The various embodiments generalize existing swept-sine analysis techniques such that they can be used for modeling and synthesis of a class of nonlinear systems, that of diagonal Volterra systems (also called parallel Hammerstein nonlinear models in the literature).

Description of the Related Art

Physical devices typically have nonlinear characteristics beyond a limited linear range of operation. Examples of nonlinear systems, without limitation, are audio transducers, loudspeakers, compression drivers, and the like. Techniques to determine the response of nonlinear systems to various stimuli are important in synthesizing nonlinear systems and in analyzing existing nonlinear systems. The linear response of a nonlinear system is of particular interest, and also the second, third and higher harmonic responses are indications of the nonlinear distortion that may be introduced by the system.

A technique to determine the response of nonlinear systems includes applying sinusoidal signals as inputs. With a sinusoidal signal as input to a nonlinear system, at the output a periodic oscillating signal will include a multiplicity of frequencies, termed harmonic frequencies. Analyzing the magnitude of the system output at each of the harmonic frequencies, relative to the magnitude of the system output at the fundamental frequency, may yield a mathematical sequence. An array of the response of each harmonic frequency forms a series of coefficients that characterize the linearity of the nonlinear system.

A mathematical sequence of harmonic coefficients may follow a construction known as a Taylor series which can be used to model a broad class of memory-less nonlinear functions. The extension of the Taylor series that adds memory or frequency dependence that is applicable to nonlinear systems is known as a Volterra model. The full Volterra model tends to be prohibitive in both memory and computation requirements for many real nonlinear systems due to the large amount of data included in the matrix. Restricting the degree of the Volterra kernels, such as considering only the diagonal elements of the Volterra allows a more manageable data complement. Diagonal models are fully accurate only for diagonal systems. Although diagonal models may not completely characterize real physical systems, diagonal modeling is an effective analytic tool because of the computational difficulties associated with the full Volterra model.

A technique to avoid the difficulty of handling the potentially massive amount of data included in the full Volterra model involves analyzing the diagonal of the Volterra matrix. This model is also known as a parallel Hammerstein model. Neglecting the off-diagonal elements eases the complexity of the analysis by reducing the data content at the expense of reduced accuracy and precision of the result. The diagonal Volterra model is a set of system response filters for each order of nonlinearity, a linear response (1st order) filter, second order filter, a third order response filter, and so on up to an Nth order response filter. Each of the response filter for a given order contain only the diagonal elements of the full multidimensional Volterra kernel at that order. The diagonal Volterra model coefficients are 'harmonically pure' in the sense that they only contain harmonic information for their respective order. The diagonal Volterra model coefficients may be calculated by first employing a swept sine analysis to obtain the harmonic response filters and then applying a Chebyshev unmixing matrix to obtain the 'pure' harmonic responses.

The existing state of the art for practical nonlinear system analysis is called a Farina swept-sine nonlinear analysis and includes a swept-sine chirp input signal that is logarithmically varying in frequency. The output of the Farina sweep generates the harmonic responses but, as initially computed, each of the order response filters of order greater than one, include cross components from other harmonics. For example, when a sine wave at a single frequency tone is squared, in the Farina spectrum one obtains a (0th order or 0 frequency) component and a 2nd order component at twice the frequency, when a sine wave at a single frequency is cubed, in the spectrum one obtains components at the original frequency and at three times the frequency, when a sine wave is raised to the 4th power, in the spectrum you get components at all even order of 4 and below, when a sine wave is raised to the 5th power, in the spectrum one obtains components at all odd orders of 5 and below. This rule continues for all higher orders: for even order harmonics, one obtains mixed harmonic energy for all even orders at the original frequency and below. Also for odd order harmonics, one obtains mixed harmonic energy for all odd harmonics at the original input frequency and below. The mixing of harmonic energy at higher orders adds mathematical complexity that imposes limitations on nonlinear systems analysis and modeling.

One shortcoming of the Farina swept-sine analysis technique followed by application of an unmixing Chebyshev matrix is that each of the time domain responses for the nonlinear orders greater than one contains energy that is spread out over time due to the phase response of the exact logarithmic swept-sine used in the analysis. The energy that is spread out over time oftentimes masks the true-phase response of the nonlinear system. Thus, the phase response of the specific logarithmic swept-sine used in analysis can actually prevent accurate measurements from being obtained.

Accordingly, more effective techniques for performing swept sine analyses would be useful.

SUMMARY

One embodiment sets forth a non-transitory computer-readable medium that, when executed by a processing unit, causes the processing unit to generate a characteristic of a nonlinear system, by performing the steps of applying a test signal to the nonlinear system, wherein the test signal comprises a varying frequency sweep, obtaining the response of the nonlinear system at each frequency included in the frequency sweep, constructing a model of the nonlinear system, applying the test signal to the model, forming a second matrix of the response of the model at each frequency included in the frequency sweep, inverting the second matrix, generating a third matrix, wherein the third matrix comprises a convolution of the first matrix and the inversion of the second matrix, forming a first polynomial, generating a fourth matrix, wherein the fourth matrix comprises a convolution of the third matrix and the first polynomial, thereby producing a fifth matrix that includes the characteristic of the nonlinear system at each frequency included in the frequency sweep.

One advantage of the disclosed techniques is that in generating an identity model of a nonlinear system, and providing the algorithm needed to determine a phase spreading function, allows a processor to remove the phase spreading and generate the linear phase-true responses of the nonlinear system at all frequencies and nonlinear orders included in a swept-sine analysis. The various embodiments disclosed herein show how to account for the phase of each nonlinear power of the input swept-sine signal to achieve phase-true and harmonically pure diagonal Volterra filters that can be used for modeling and synthesis of nonlinear systems.

BRIEF DESCRIPTION OF THE SEVERAL VIEWS OF THE DRAWINGS

So that the manner in which the recited features of the one more embodiments set forth above can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of various embodiments subsumes other embodiments as well.

DETAILED DESCRIPTION

In the following description, numerous specific details are set forth to provide a more thorough understanding of certain specific embodiments. However, it will be apparent to one of skill in the art that other embodiments may be practiced without one or more of these specific details or with additional specific details.

Figure 1:
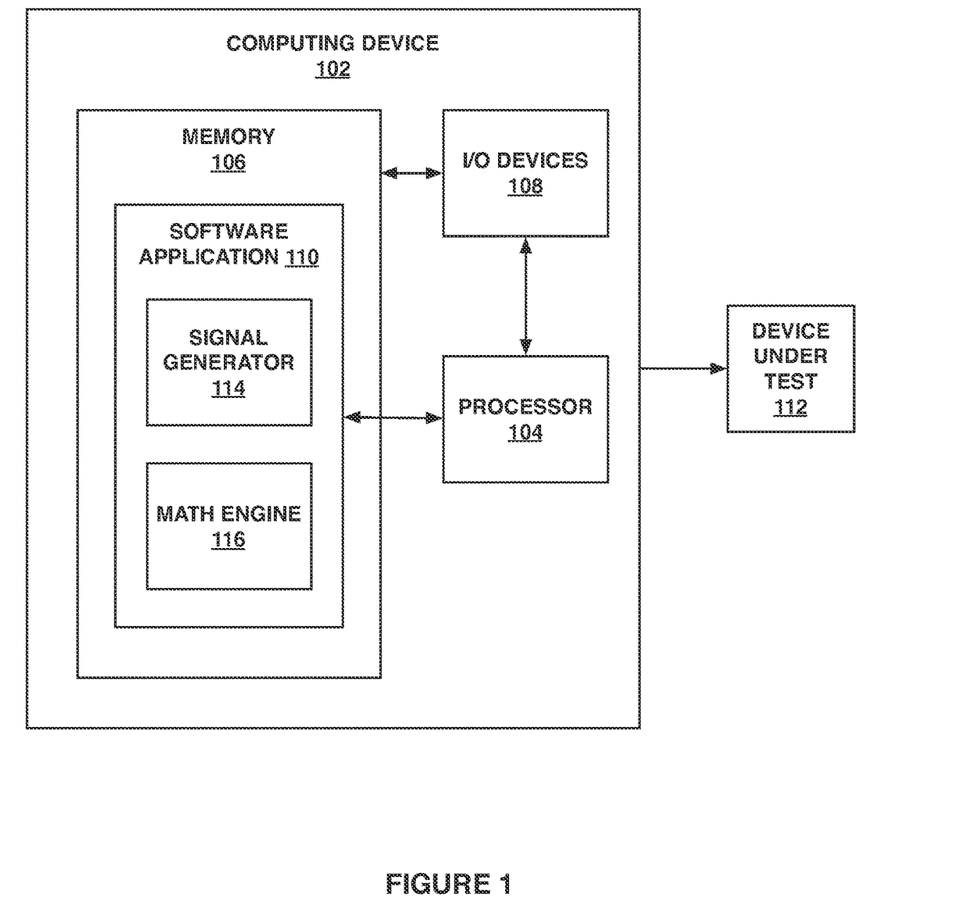
FIG. 1 illustrates a computing device configured to implement one or more aspects of the various embodiments.

FIG. 1 illustrates a computing device 102 configured to implement one or more aspects of the various embodiments. As shown, computing device 102 includes, without limitation, processor 104, input/output (I/O) devices 108, and memory 106. Memory 106 includes software application 110 that, in turn, includes signal generator 114, and math engine 116. Computing device 102 is coupled to device under test 112.

Software application 110 includes program code that, when executed by processor 104, generates the linear response of device under test 112 over the full range of input frequency. Software application 110 provides input to signal generator 114, which provides stimulus to device under test 112. Software application 110 examines the response of device under test 112 and provides input to math engine 116, which computes characteristics of device under test 112.

In operation, signal generator 114 generates a sinusoidal signal, known as a chirp, for which the frequency changes logarithmically with time. Software application 110 then outputs the chirp to the device under test 112 as a stimulus. Device under test 112 may be, for example without limitation, a loudspeaker or compression driver, or any physical or simulated nonlinear system. Software application 110 determines the response of device under test 112, that is, the Farina swept-sine response (containing mixed harmonic energy of even/odd orders at and below the order), for each order included in the analysis. In addition to the mixing of harmonic energies across nonlinear orders that occurs with swept-sine harmonic computations, the phase response of the swept-sine raised to nonlinear powers must also be accounted for. The exact phase response at each integer power for the given swept-sine is dependent on the logarithmic sweep parameters: start frequency, stop frequency, duration, sample rate as well as any windowing operations that have been applied. Calculation of the order responses to the "identity diagonal Volterra system" determines the phase responses. The identity Volterra system is described by equation 1. As shown, equation 1 contains no cross terms, such as x(n)x(n−1), which illustrates that the system is a diagonal identity Volterra system.

$$y(n)=x(n)+x^2(n)+x^3(n)+\ldots+x^N(n) \qquad 1)$$

Math engine 116 then generates an identity model of the nonlinear system that includes unity coefficients for all orders of harmonic response. The first order output is simply the unmodified swept-sine input at unity gain. The second order output is the swept-sine input squared at unity gain. The third order output is the swept-sine input signal cubed at unity gain. The sequence continues to the nth order output, which is the magnitude raised to the nth power with unity gain.

Figure 3:
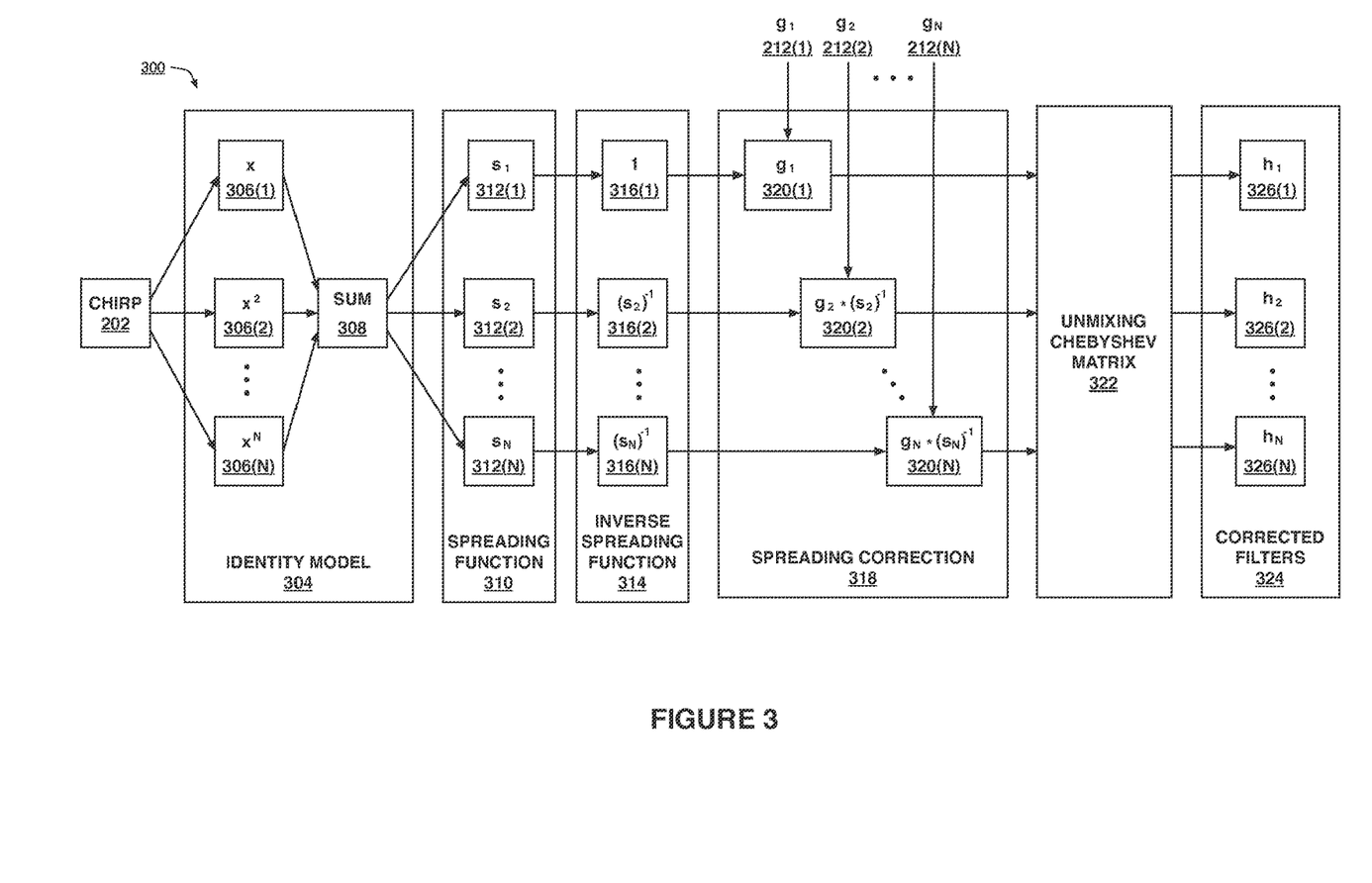
FIG. 3 illustrates processing stages associated with determining one or more spectral correction elements for a nonlinear device, according to various embodiments.

The array of spreading function filters 310 represent all-pass or phase-only spreading functions that cause the composite outputs of the nonlinear system to spread in the time domain. An all-pass or phase-only filter will not change the magnitude spectrum response, and will only change the time delays associated with each frequency.

Math engine 116 then computes inverse spreading coefficients by taking the inverse of each component in the array of output spreading filters of the identity model. Math engine 116 then further computes spreading correction filters by convolving the inverse spreading coefficients with the Farina harmonic response filters of device under test 112 or simulated model.

Math engine 116 then constructs the unmixing Chebyshev matrix of the set of spreading correction filters. The Chebyshev matrix is formed using the Chebyshev polynomials of the first kind. These polynomials describe the magnitude energy contributions for each harmonic in the uncorrected Farina or swept-sine nonlinear harmonic spectrums. The unmixing Chebyshev matrix is a conventional mathematical construction that may facilitate analytically generating the extraneous cross products of frequency in the output of a nonlinear system. The matrix shown in equation 2 is an example of a sixth order unmixing Chebyshev matrix.

$$A_c^y = \begin{vmatrix} 1 & 0 & -3 & 0 & 5 & 0 \\ 0 & 2 & 0 & -8 & 0 & 18 \\ 0 & 0 & 4 & 0 & -20 & 0 \\ 0 & 0 & 0 & 8 & 0 & -48 \\ 0 & 0 & 0 & 0 & 16 & 0 \\ 0 & 0 & 0 & 0 & 0 & 32 \end{vmatrix} \quad 2)$$

By application of the set of the de-spreading filters to the Farina swept-sine response filters along with the unmixing Chebyshev matrix, the extraneous cross components are eliminated and true-phase response filters are obtained.

As a result, math engine 116 generates a matrix that includes the response of the nonlinear system at all frequencies and orders of nonlinearity in the analysis. The resulting matrix may facilitate analysis of physical systems, such as, for example and without limitation, audio transducers or loudspeakers, or of simulated or virtual nonlinear systems. Further, with sufficient computing resources, the resulting matrix may facilitate synthesis of physical or virtual nonlinear systems.

Figure 2:
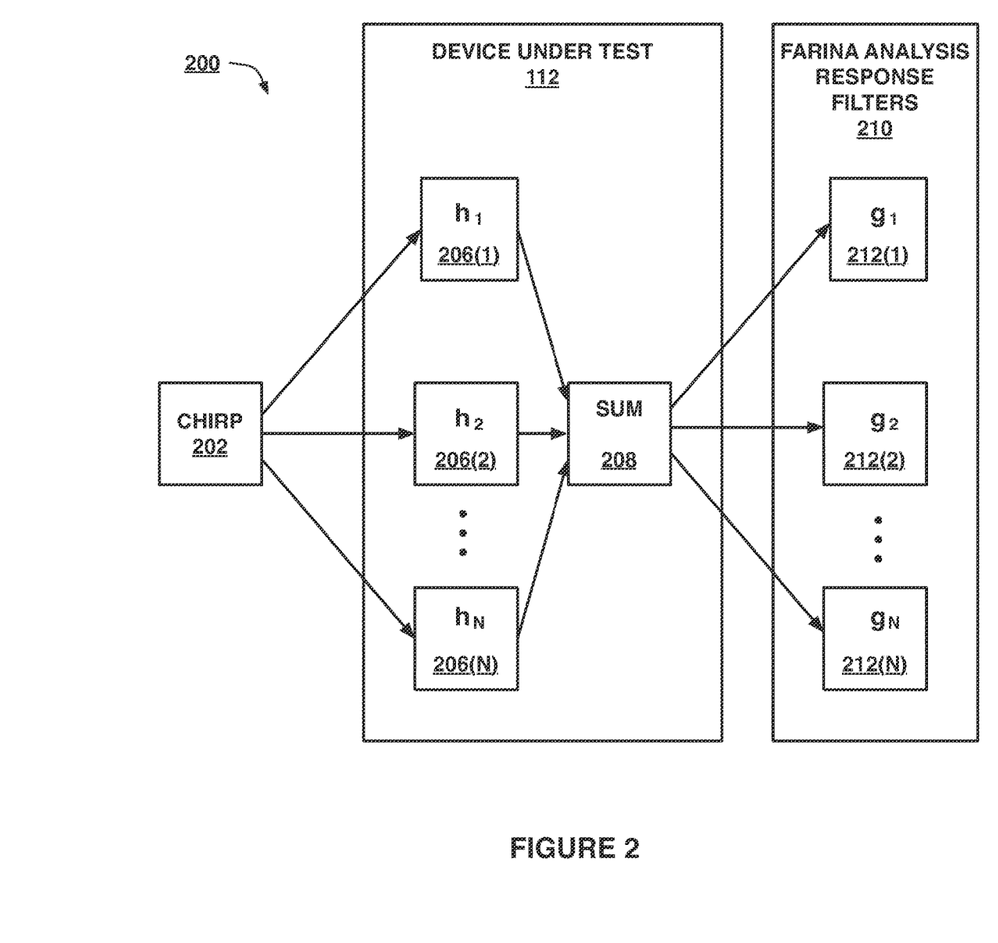
FIG. 2 illustrates processing stages associated with determining an output of a nonlinear device, according to various embodiments.

FIG. 2 illustrates processing stages 200 associated with determining the output of a nonlinear device, according to various embodiments. Software application 110, when invoked by processor 104, executes the illustrated processing steps. As shown, chirp 202 is an input to processing stages 200. The input chirp 202, or swept-sine, is sent to a device under test 112. Device under test 112 may include a simulated nonlinear system. As further shown, processing stages 200 include device under test 112, and Farina harmonic response filters 210. Device under test 112 includes first order transfer function 206(1), second order transfer function 206(2), and Nth order transfer function 206(N), and sum 208. The Farina harmonic response filters 210 includes the first order Farina harmonic response filter 212(1), the second order Farina harmonic response filter 212(2), and the Nth order Farina harmonic response filter 212(N).

Signal generator 114 generates chirp 202, and then applies chirp 202 to the device under test 112. In doing so, signal generator 114 processes chirp 202 with each transfer function 206. Math engine 116 then generates harmonic responses including, the first order Farina harmonic response filter 212(1), the second order Farina harmonic response filter 212(2), through the Nth order Farina harmonic response filter 212(N).

Farina harmonic response filter 210 are then output to further processing stages in which the Farina harmonic response filter 210 are convolved with an inverse spreading function, as described in detail below in conjunction with FIG. 3.

FIG. 3 illustrates processing stages 300 associated with determining spectral correction elements for a nonlinear device, according to various embodiments. Software application 110, when executed by processor 104, performs processing stages 300. As shown, processing stages 300 includes identity model 304, which includes first order identity model output 306(1), second order identity model output 306(2), through Nth order identity model output 306(N), and sum 308. Software application 110 applies the output of identity model 304 as the input to spreading function filters 310. The calculation block performs the Farina harmonic analysis with exactly the same parameters as the analysis done on the device under test 112 or on simulated diagonal Volterra model. Identity model 304 includes first order nonlinear output filter 312(1), second order nonlinear output filter 312(2), through Nth order nonlinear output filter 312(N).

Math engine 116 then uses the outputs of nonlinear output filters 312 as inputs to inverse spreading function 314, which includes first order inverse spreading filter 316(1), second order inverse spreading filter 316(2), through Nth order inverse spreading filter 316(N). Math engine 116 couples the outputs of inverse spreading filters 316 as inputs to spreading correction 318, which includes first order spreading correction filter 320(1), second order spreading correction filter 320(2), through Nth order spreading correction filter 320(N).

Math engine 116 outputs spreading correction filters 320 as inputs to unmixing Chebyshev matrix 322. Math engine 116 further outputs unmixing Chebyshev matrix 322 as the input to corrected filters 324, which includes first order linear response filter 326(1), second order linear response filter 326(2), through Nth order linear response filter 326(N).

Chirp 202 is a test signal that includes an identical logarithmic swept-sine, as described above in conjunction with FIG. 2. Software application 110 applies chirp 202 to identity model 304. Identity model 304 is a diagonal Volterra model that includes unity coefficients for all orders of harmonic response. First order identity model output 306(1) represents the output due to input signal, chirp 202. Second order identity model output 306(2) represents the output due to the square of the input signal, chirp 202. Nth order identity model output 306(N) represents the output due to the input signal, chirp 202, raised to the Nth power.

Signal generator 114 generates chirp 202 and math engine 116 constructs the identity model 304. Software application 110 then applies chirp 202 as the input to identity model 304 as well as to the device under test 112. Math engine 116 computes first order identity model output 306(1), second output 306(2), through Nth order output 306(N). Sum 308 adds all the harmonic responses, and math engine 116 outputs identity model outputs 306 and runs Farina harmonic analysis to produce spreading function filters 310 of the identity model 304. First order nonlinear output 312(1) represents the linear dispersion filter in the time domain. Second order nonlinear output 312(2) represents the second order dispersion filter in the time domain. Nth order nonlinear output 312(N) represents the Nth order dispersion filter in the time domain. Math engine 116 then computes the inverse spreading function 314 by taking the inverse filter of the spreading function filters 310. Inverse spreading filter 316(1) is the first order inverse spreading filter included in spreading function 314. Inverse spreading filter 316(2) is the second order inverse spreading filter included in inverse spreading function 314. Inverse spreading filter 316(N) is the Nth order inverse spreading filter included in inverse spreading function 314.

Math engine 116 generates spreading correction 318 by convolving inverse spreading filters 316 with Farina harmonic response filters 210. Spreading corrected filter 320(1) results from the convolution of inverse spreading filter 316(1) with the first order Farina harmonic response filter 212(1). Second order spreading correction filter 320(2) results from the convolution of inverse spreading filter 316(2) with the second order Farina harmonic response filter 212(2). Spreading correction filter 320(N) results from the convolution of inverse spreading filter 316(N) with the Nth order Farina harmonic response filter 212(N).

Math engine 116 then computes the unmixing Chebyshev matrix 322 and convolves the spreading corrected filters 320 with the elements of the unmixing Chebyshev matrix 322. The result of the convolution contains the corrected filters 326 that include first order fully corrected linear response filter 326(1), second order corrected response filter 326(2), through Nth order corrected response filter 326(N).

Figure 4:
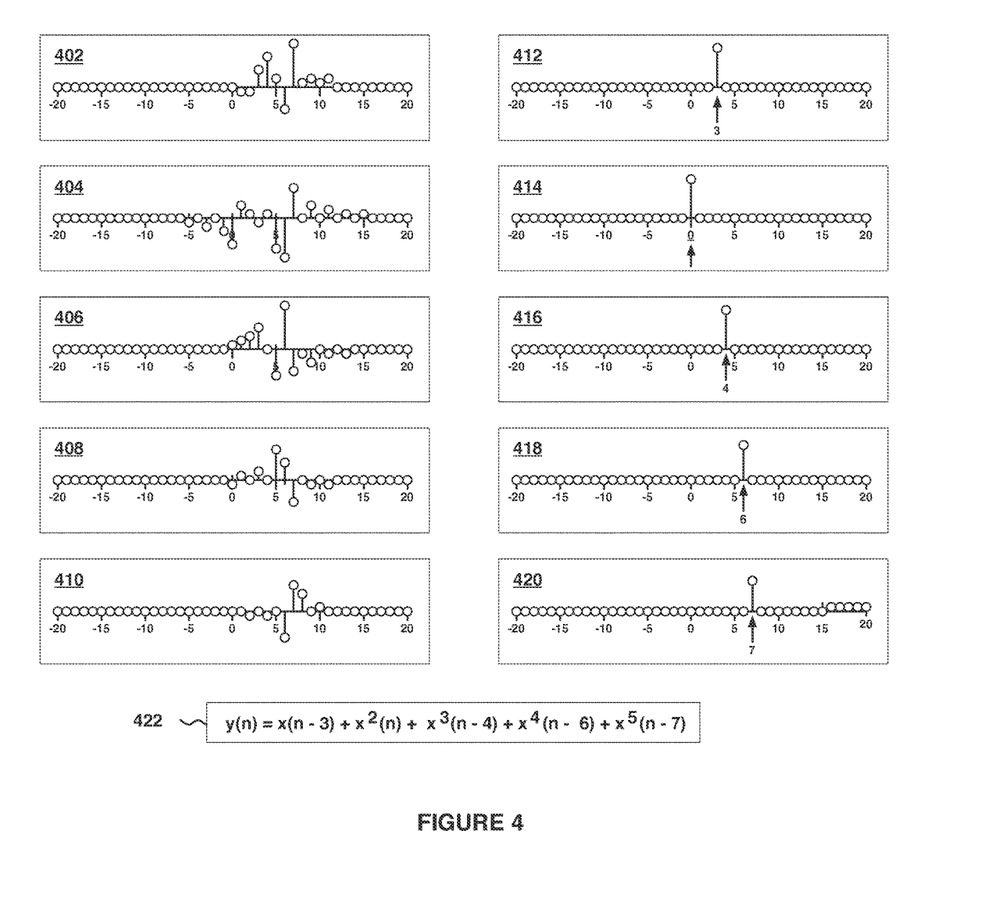
FIG. 4 illustrates time domain nonlinear system responses with and without phase correction, according to various embodiments.

FIG. 4 illustrates time domain nonlinear system responses with and without phase correction, according to various embodiments. As shown, plots 402, 404, 406, 408 and 410 represent the five orders of time domain responses of the system represented by equation 422, without phase correction. As further shown, plots 412, 414, 416, 418 and 420 represent the five orders of time domain responses of the system represented by equation 422, with phase correction.

Using this simple system as a test clearly shows the efficacy of the phase correction provided by the various embodiments. The nonlinear system under test is described by equation 3.

$$y(n)=x(n-3)+x^2(n)+x^3(n-4)+x^4(n-6)+x^5(n-7) \qquad 3)$$

FIG. 4 illustrates the time domain responses of orders 1 through 5. In the time domain, the magnitude of the response illustrated in plot 402 is equal to the magnitude of the response illustrated in plot 412. However, the response illustrated in plot 402 is corrupted by the phase differences introduced by Similarly, The input swept-sine signal is delayed by 3 samples. The result is added to the square of the input. The result is added to the cube of the input delayed by 4 samples. The result is added to the fourth power of the input delayed by 6 samples. The result is added to the fifth power of the input delayed by 7 samples. The time domain responses shown in FIG. 4 illustrate the outputs of a representative nonlinear system that serves as an example of typical embodiments and is therefore not to be considered limiting in any manner. Output time domain responses 402 through 410 illustrate the output of five harmonic orders of Farina harmonic response of the nonlinear system described above by equation 3, as described in detail above in conjunction with FIG. 2. As shown, the coefficients shown in output filters 402 through 410 show that the energy occurs spread out in time instead of at a single time delay. Output spectra 412 through 420 illustrate the fully corrected diagonal Volterra response filters calculated using the despreading operations of the various embodiments, The Farina time domain response filters shown in 412 through 420 represent the linear response of the nonlinear system at all five orders used in the analysis. The phase corrected filters in 412 through 420 are suitable for modeling a diagonal Volterra system whereas 402 through 410 are not.

Output filter 402 illustrates the linear Farina harmonic response corrected using the harmonic unmixing Chebyshev matrix but not corrected for the phase of the input swept-sine and its mixed harmonics. The energy in the diagonal Volterra response is spread out in time, and, thus, the coefficients occur, as shown, in multiple locations with varying magnitudes. The most prominent peak occurs at 7, in this example, but other, less prominent peaks also occur. Therefore, determining the true linear response is inhibited. Output spectrum 412 illustrates the Diagonal Volterra response of the fundamental frequency after post-processing using the disclosed algorithm. As shown, the single peak, occurring at 3 in this example, represents the true linear response of the fundamental frequency of the representative nonlinear system.

Output spectrum 404 illustrates the Diagonal Volterra response of the second order harmonic frequency. The energy in the Diagonal Volterra response is spread out in time, and, thus, the coefficients occur, as shown, in multiple locations with varying magnitudes. The most prominent peak occurs at 7, in this example, but other, less prominent peaks also occur. Therefore, determining the true linear response is inhibited. Output spectrum 414 illustrates the Diagonal Volterra response of the fundamental frequency after post-processing using the disclosed algorithm. As shown, the single peak, occurring at 0 in this example, represents the true linear response of the second order harmonic frequency of the representative nonlinear system.

Output spectrum 406 illustrates the Diagonal Volterra response of the third order harmonic frequency. The energy in the Diagonal Volterra response is spread out in time, and, thus, the coefficients occur, as shown, in multiple locations with varying magnitudes. The most prominent peak occurs at 6, in this example, but other, less prominent peaks also occur. Therefore, determining the true linear response is inhibited. Output spectrum 416 illustrates the Diagonal Volterra response of the fundamental frequency after post-processing using the disclosed algorithm. As shown, the single peak, occurring at 4 in this example, represents the true linear response of third order harmonic frequency of the representative nonlinear system.

Output spectrum 408 illustrates the Diagonal Volterra response of the fourth order harmonic frequency. The energy in the Diagonal Volterra response is spread out in time, and, thus, the coefficients occur, as shown, in multiple locations with varying magnitudes. The most prominent peak occurs at 5, in this example, but other, less prominent peaks also occur. Therefore, determining the true linear response is inhibited. Output spectrum 418 illustrates the Diagonal Volterra response of the fundamental frequency after post-processing using the disclosed algorithm. As shown, the single peak, occurring at 6 in this example, represents the true linear response of fourth order harmonic frequency of the representative nonlinear system.

Output spectrum 410 illustrates the Diagonal Volterra response of the fifth order harmonic frequency. The energy in the Diagonal Volterra response is spread out in time, and, thus, the coefficients occur, as shown, in multiple locations with varying magnitudes. The most prominent peak occurs at 7, in this example, but other, less prominent peaks also occur. Therefore, determining the true linear response is inhibited. Output spectrum 420 illustrates the Diagonal Volterra response of the fundamental frequency after post-processing using the disclosed algorithm. As shown, the single peak, occurring at 7 in this example, represents the true linear response of fifth order harmonic frequency of the representative nonlinear system.

In addition to the mixing of harmonic energies across nonlinear orders that occurs with swept-sine harmonic computations, the phase response of the swept-sine raised to nonlinear powers must also be accounted for. The exact phase response at each integer power for the given swept-sine is dependent on the logarithmic sweep parameters: start frequency, stop frequency, duration, sample rate as well as any windowing operations that have been applied.

Figure 5:
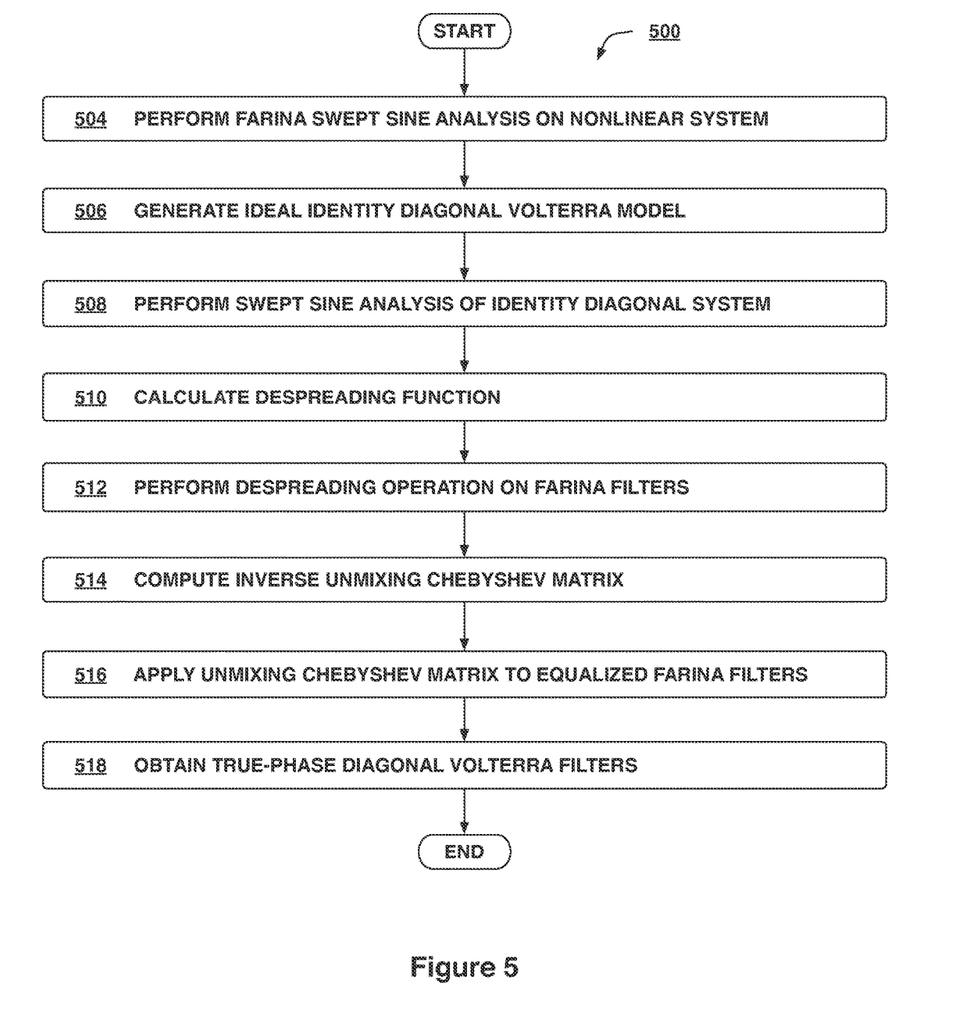
FIG. 5 is a flow diagram of method steps for generating spectral correction elements for a nonlinear device, according to various embodiments.

FIG. 5 is a flow diagram of method steps for generating spectral correction elements for a nonlinear device, according to various embodiments. Although the method steps are described in conjunction with the systems of FIGS. 1-4, persons skilled in the art will understand that any system configured to perform the method steps, in any order, is within the scope of the various embodiments.

As shown, a method 500 begins at step 504, where software application 110 performs a Farina swept sine analysis on a nonlinear system by coupling a sinusoidal signal with logarithmically changing frequency to device under test 112.

At step 506, software application 110 generates the ideal identity diagonal Volterra model 204 of device under test 112. At step 508, software application 110 performs a swept sine analysis of the ideal identity diagonal Volterra model 204 by coupling a sinusoidal signal with logarithmically changing frequency, with identical parameters to that used to generate the Farina harmonic response filters, to the ideal identity diagonal Volterra model 204. At step 510, math engine 116 calculates the despreading function of device under test 112.

At step 512, math engine 116 performs the despreading operation on the ideal identity diagonal Volterra model 204 by convolving the inverse spreading filters 316 with the Farina harmonic response filters 212 of the device under test 112 to yield the spreading correction filters 320. At step 514, math engine 116 constructs the unmixing Chebyshev matrix 322.

At step 516, math engine 116 convolves the matrix of linear response filters 326, that is, the equalized Farina filters, with the unmixing Chebyshev matrix, thus eliminating the extraneous cross harmonic components. At step 518, math engine 116 obtains the true-phase diagonal Volterra filters. Software application 110 may then create an accurate model that includes the true linear response at all sampled frequencies and nonlinear orders under analysis.

In sum, a software application uncovers phase spreading that corrupts the response filters of a nonlinear system and executes a corrective algorithm. The algorithm generates the true-phase filters of the system response over all nonlinear orders used in the nonlinear analysis. The application first outputs a test signal, or chirp, with logarithmically changing frequency, as a stimulus to the nonlinear system to generate a set of Farina harmonic response filters. The application then constructs an identity model and excites the identity model with an identical chirp, output under identical conditions, to generate a set of spreading function filters. The application computes the inverse of the spreading function filters and convolves the inverse of the spreading function filters with the Farina harmonic response filters to generate a set of spreading corrected filters. Finally, the application constructs the unmixing Chebyshev matrix and convolves the spreading corrected filters with the unmixing Chebyshev matrix to remove the spreading and generate harmonically pure and phase-corrected filters.

Advantageously, the techniques disclosed herein allow a substantial improvement in the accuracy of swept-sine analyses of nonlinear systems. The disclosed techniques generate accurate coefficients to the response of a system under test at all harmonic frequencies included in the sweep sample space. Determining accurate coefficients of the response facilitates spectrum analysis of the characteristics of the system. Further, given adequate computing resources, the disclosed techniques may facilitate the synthesis of both physical and simulated nonlinear systems.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general-purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. One or more non-transitory computer-readable media including instructions that, when executed by a processor, configure the processor to perform the steps of:
applying a test signal to a nonlinear system;
determining a first response of the nonlinear system to the test signal;
determining a phase spreading function associated with the first response by performing the steps of:
constructing an identity diagonal Volterra model of the nonlinear system;
applying the test signal to the identity diagonal Volterra model; and
generating a second response of the identity diagonal Volterra model;
generating a corrective function based on the phase spreading function; and
applying the corrective function to the first response to generate a corrected first response for the nonlinear system,
wherein an effect of the phase spreading function on the corrected first response is less than the effect of the phase spreading function on the first response.

2. The one or more non-transitory computer-readable media of claim 1, wherein the test signal comprises a logarithmically varying sweep across a range of frequencies.

3. The one or more non-transitory computer-readable media of claim 2, wherein
generating the second response of the identity diagonal Volterra model comprises generating the second response of the identity diagonal Volterra model at frequencies included in the range of frequencies.

4. The one or more non-transitory computer-readable media of claim 3, wherein the identity diagonal Volterra model of the nonlinear system comprises a plurality of unity gain elements at each nonlinear orders included in the range of frequencies.

5. The one or more non-transitory computer-readable media of claim 3, wherein generating the corrective function comprises:
constructing a first matrix associated with the first response;
constructing a second matrix associated with the second response;
inverting the second matrix;
performing a convolution of the first matrix and the inverted second matrix to generate a third matrix;
forming a first polynomial; and
performing a convolution of the third matrix and the first polynomial to generate a fourth matrix.

6. The one or more non-transitory computer-readable media of claim 5, wherein the first polynomial comprises an inverse Chebyshev matrix wherein each matrix element is taken from a Chebyshev polynomial.

7. The one or more non-transitory computer-readable media of claim 1, further comprising determining a linear response of the nonlinear system.

8. The one or more non-transitory computer-readable media of claim 1, wherein the first response comprises a diagonal Volterra response of the nonlinear system.

9. The one or more non-transitory computer-readable media of claim 1, wherein the nonlinear system comprises a loudspeaker.

10. A method comprising:
applying a test signal to a nonlinear system;
determining a first response of the nonlinear system to the test signal;
determining a phase spreading function associated with the first response by performing the steps of:
constructing an identity diagonal Volterra model of the nonlinear system;
applying the test signal to the identity diagonal Volterra model; and
generating a second response of the identity diagonal Volterra model;
generating a corrective function based on the phase spreading function; and
applying the corrective function to the first response to generate a corrected first response for the nonlinear system,
wherein an effect of the phase spreading function on the corrected first response is less than the effect of the phase spreading function on the first response.

11. The computer-implemented method of claim 10, wherein the phase spreading function masks a linear gain of the nonlinear system.

12. The computer-implemented method of claim 10, wherein the test signal comprises a logarithmically varying sweep across a range of frequencies.

13. The computer-implemented method of claim 12, wherein
generating the second response of the identity diagonal Volterra model comprises generating the second response of the identity diagonal Volterra model at frequencies included in the range of frequencies.

14. The computer-implemented method of claim 13, wherein generating the corrective function comprises:
constructing a first matrix associated with the first response;
constructing a second matrix associated with the second response;
inverting the second matrix;
performing a convolution of the first matrix and the inverted second matrix to generate a third matrix;
forming a first polynomial; and
performing a convolution of the third matrix and the first polynomial to generate a fourth matrix.

15. The computer-implemented method of claim 10, wherein the nonlinear system comprises a simulation of a physical system.

16. A system comprising:
a memory that includes instructions; and
a processor that is coupled to the memory and, upon executing the instructions, performs the steps of:
generating a test signal;
applying the test signal to a nonlinear system;
determining a first response of the nonlinear system to the test signal;
determining a phase spreading function associated with the first response by performing the steps of:
constructing an identity diagonal Volterra model of the nonlinear system;
applying the test signal to the identity diagonal Volterra model; and
generating a second response of the identity diagonal Volterra model;
generating a corrective function based on the phase spreading function; and applying the corrective function to the first response to generate a corrected first response for the nonlinear system,
wherein an effect of the phase spreading function on the corrected first response is less than the effect of the phase spreading function on the first response.

17. The system of claim 16, wherein the test signal comprises a sweep across a range of frequencies, wherein the nonlinear system operates within the range of frequencies.

18. The system of claim 16, wherein generating the second response of the identity diagonal Volterra model comprises generating the second response of the identity diagonal Volterra model at frequencies included in the range of frequencies.

19. The system of claim 18, wherein generating the corrective function comprises:
constructing a first matrix of the first response;
constructing a second matrix of the second response;
inverting the second matrix; and
performing a convolution of the first matrix and the inverted second matrix to generate a third matrix.

20. The system of claim 19, wherein generating the corrective function further comprises:
forming a first polynomial; and
performing a convolution of the third matrix and the first polynomial to generate a fourth matrix.

* * * * *